US008544165B2

(12) United States Patent
Leung et al.

(10) Patent No.: US 8,544,165 B2
(45) Date of Patent: Oct. 1, 2013

(54) APPARATUS FOR ALIGNING ELECTRONIC COMPONENTS

(75) Inventors: Chi Kuen Vincent Leung, Hong Kong (HK); Bin Xie, Hong Kong (CN); Xunqing Shi, Hong Kong (SG)

(73) Assignee: Hong Kong Applied Science & Technology Research Institute Co., Ltd., Shatin, New Territories (HK)

( * ) Notice: Subject to any disclaimer, the term of this patent is extended or adjusted under 35 U.S.C. 154(b) by 659 days.

(21) Appl. No.: 12/748,997

(22) Filed: Mar. 29, 2010

(65) Prior Publication Data

US 2011/0235299 A1  Sep. 29, 2011

(51) Int. Cl.
*B23P 19/00* (2006.01)
(52) U.S. Cl.
USPC ............... 29/739; 29/740; 29/741; 228/4.1; 228/5.5
(58) Field of Classification Search
USPC ............ 29/739, 740, 741; 228/4.1, 5.5
See application file for complete search history.

(56) References Cited

U.S. PATENT DOCUMENTS

| 4,877,174 A * | 10/1989 | Bruhn ........................... 228/5.1 |
| 5,070,988 A * | 12/1991 | Konishi et al. ................ 198/380 |
| 5,203,143 A * | 4/1993 | Gutentag ........................ 53/452 |
| 5,216,257 A | 6/1993 | Brueck et al. |
| 7,043,055 B1 | 5/2006 | Silver |
| 2004/0151828 A1 | 8/2004 | Zribi |
| 2009/0079452 A1* | 3/2009 | Eldridge et al. ............. 324/758 |
| 2009/0202333 A1* | 8/2009 | Ozono et al. ................. 414/800 |

FOREIGN PATENT DOCUMENTS

| WO | WO 2009/078816 | 6/2009 |
| WO | WO 2009/078816 A1 | 6/2009 |

OTHER PUBLICATIONS

Sakuma, et al.: *"Characterization of Stacked Die Using Die-to-Wafer Integration for High Yield and Throughput"*; 2008 Electronic Components and Technology Conference; Sep. 2008; pp. 18-23.

* cited by examiner

*Primary Examiner* — Carl Arbes

(57) ABSTRACT

A method of aligning electronic components comprising providing a positioning member 110 having at least one formation 120 for receiving an electronic component; said at least one formation having lateral boundaries 35, 36 for constraining movement of an electronic component; placing a first electronic component 10a in said at least one formation; and providing a force for actively aligning said first electronic component with a lateral boundary of said at least one formation. The force may, for example, be provided by tilting the positioning member, by providing suction or by using an actuator. An apparatus for aligning electronic components and a 3D system of stacked electronic components is also disclosed.

10 Claims, 10 Drawing Sheets

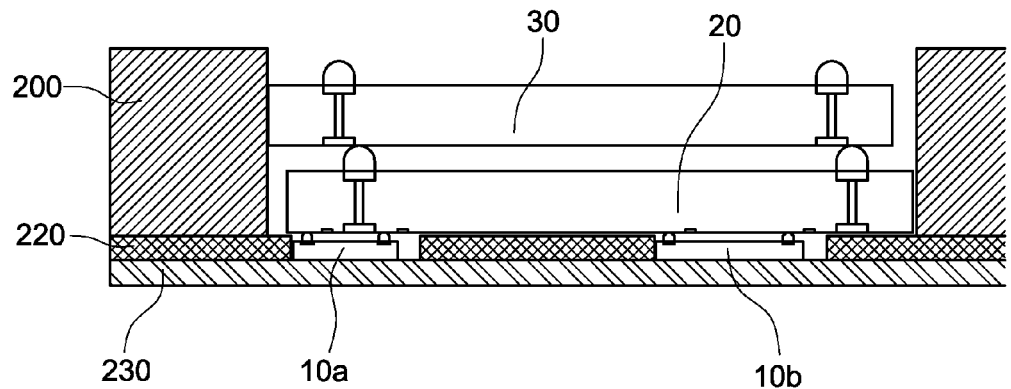
FIG.5   Chip to Chip stacking
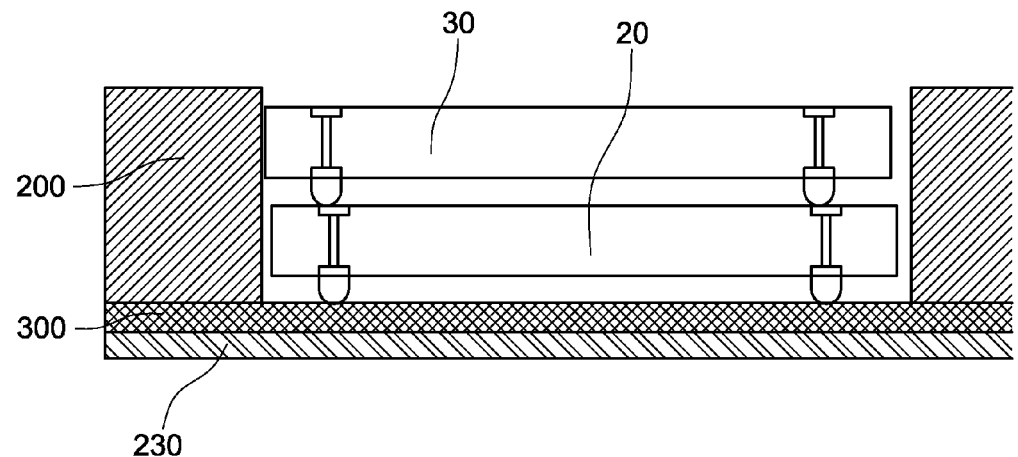
FIG.6   Chip to Wafer stacking

APPARATUS FOR ALIGNING ELECTRONIC COMPONENTS

FIELD OF THE INVENTION

The present invention relates to a method and apparatus for aligning electronic components. The method and apparatus may be used in the manufacture of a 3D system comprising stacked electronic components.

BACKGROUND 3D systems are commonly used when it is desired to stack various electronic components one on top of the other. Package on Package (PoP) arrangements are a common example. Typically a top package comprises a processor integrated circuit (IC), while the bottom package comprises a memory IC. Such PoP arrangements are typically used in digital cameras, mobile phones etc. The present invention particularly, but not exclusively, relates to 3D systems in which one or both of the electronic components comprises an integrated circuit.

Typically electronic components are stacked by a machine which collects each component one at time, aligns the current component with the previous component, places the current component on top of the previous component and then collects the next component. Typically the alignment is performed visually. This process is time consuming as it takes time to visually align each component and each component is aligned separately. As the process is time consuming, it is costly.

WO2009/078816 discloses an alignment method in which a plurality of IC dies are mounted to a plurality of ICs provided on a wafer. A positioning member having a plurality of cavities is placed on top of the wafer in a position which aligns the cavities with the ICs of the wafer. The IC dies are then placed into the cavities of the positioning member. The cavities help to align the IC dies with the wafer ICs. The entire disclosure of WO2009/078816 is incorporated herein by reference.

It would be desirable to provide a new method of aligning electronic components; preferably the new method would provide better accuracy and/or speed of alignment.

SUMMARY OF THE INVENTION

A first aspect of the invention provides a method of aligning electronic components comprising:—
a) providing a positioning member having at least one formation for receiving an electronic component; said at least one formation having lateral boundaries for constraining movement of an electronic component;
b) placing a first electronic component in said at least one formation; and
c) providing a force for actively aligning said first electronic component with a lateral boundary of said at least one formation.

The force need not be in the direction of a lateral boundary of the formation, but should cause the electronic component to move towards and into alignment with the lateral boundary. The force may have a component which acts towards a lateral boundary of the formation. Preferably there are a plurality of formations for receiving electronic components, each formation having lateral boundaries. The at least one formation or plurality of formations is/are preferably cavities in the positioning member and the lateral boundaries are preferably side walls of the cavities. Alternatively the lateral boundaries may be a plurality of spaced apart posts or protrusions which limit movement of an electronic component within the formation. The method allows quick alignment of a plurality of electronic components as electronic components in different formations, or multiple electronic components placed in the same formation may be aligned simultaneously by using said force.

Preferably the force aligns the electronic component with two adjoining lateral boundaries of the formation. Where the formation is a cavity the force preferably aligns the electronic component with a corner of the cavity. The force for actively aligning the electronic component may be provided by any appropriate method; gravity, suction and pushing by an actuator are three possible examples, but the invention is not limited to these.

Another electronic component may be provided either above or below said first electronic component and in step c) said first electronic component and said another electronic component may be aligned with each other.

A second aspect of the invention provides a method of manufacturing a 3D system comprising aligning a first electronic component with one or more other electronic components by using the first aspect of the invention and then bonding said first electronic component and said one or more other electronic components together.

A third aspect of the present invention provides a 3D system comprising an electronic component mounted on top of another electronic component; said 3D system having been manufactured according to the method of the second aspect of the invention.

A fourth aspect of the present invention provides an apparatus for aligning electronic components comprising a positioning member having at least one formation for receiving an electronic component; said at least one formation having lateral boundaries for constraining movement of the electronic component; and an alignment mechanism for providing a force for actively aligning one or more electronic components placed in said at least one formation with a lateral boundary of said at least one formation.

A fifth aspect of the present invention provides an apparatus for aligning electronic components comprising a positioning member having a plurality of formations for receiving electronic components; said formations having lateral boundaries; and an alignment mechanism for providing a force for actively aligning electronic components placed in said formations with lateral boundaries of said formations.

BRIEF DESCRIPTION OF THE FIGURES

Preferred embodiments of the present invention will now be described, by way of example only, with reference to the accompanying drawings in which:—

FIG. 2 (b) is a close up view of some of the formations of the positioning member of FIG. 2 (a) and illustrates the direction of the forces for aligning the electronic components;

FIG. 5 illustrates stacking of electronic components within a cavity of the positioning member;

FIG. 6 illustrates stacking of electronic components within a cavity of the positioning member for mounting onto a wafer;

FIG. 11 (b) illustrates an electronic component placed inside the cavity of the positioning member of FIG. 11 (a);

DESCRIPTION

Figure 1:
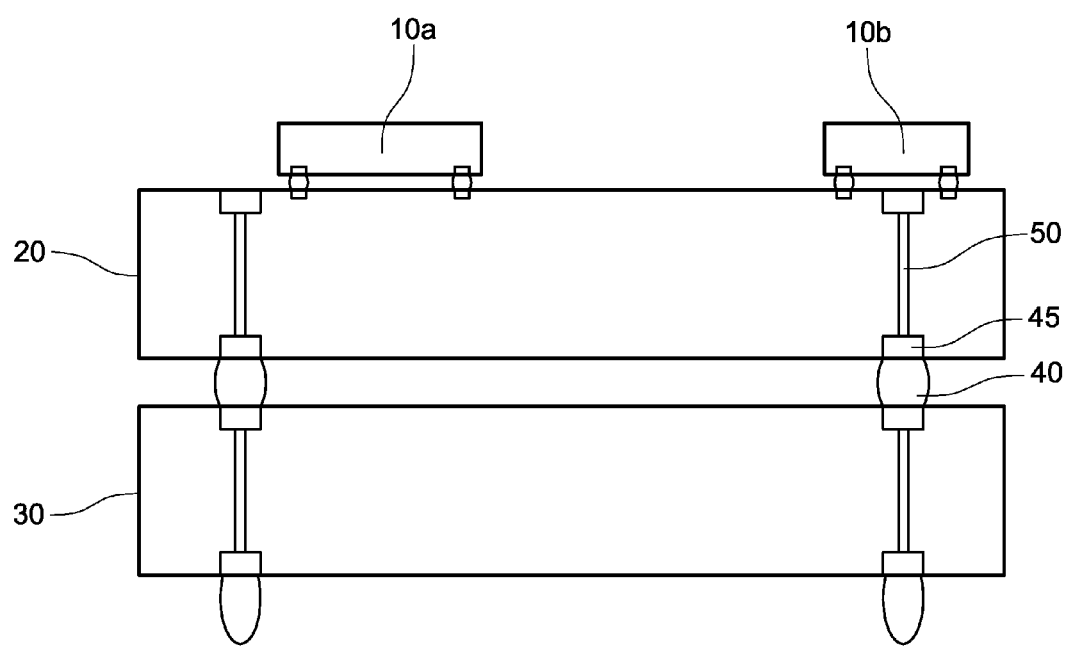
FIG. 1 is a schematic diagram of a 3D system comprising stacked electronic components.

FIG. 1 shows a 3D system comprising stacked electronic components. The arrangement has two first level electronic components 10a, 10b stacked on top of a second level electronic component 20. The second level electronic component is stacked on top of a third level electronic component 30. The electronic components preferably comprise integrated circuits. However, alternatively, one or more of the electronic components may not comprise an integrated circuit, but may be a resistor, capacitor or other type of electronic component. The electronic components may be bonded together, for example by using solder balls 40 or any other appropriate bonding method for the electronic components.

The electronic components may have bonding pads 45 for connecting the electronic components to other components or external contacts. A via 50 may connect bonding pads on opposite side of an electronic component. The bonding pads may be connected to operating parts of the electronic component, e.g. the bonding pads may be connected to an I/O of an integrated circuit of the electronic component. Such features are conventional and well understood by a person skilled in the art and so will not be described further.

While there are three layers in the 3D system of FIG. 1, this is by way of example only. There may be only two layers, or there may be more than three layers. In FIG. 1 the first layer has two electronic components, which are of a relatively smaller size, while the second and third layers have one component each and are of a relatively larger size. This is by way of example only. Each layer may have a different number of electronic components which may be a different size to, or same size as, the components in one or more of the other layers.

Figure 2A:
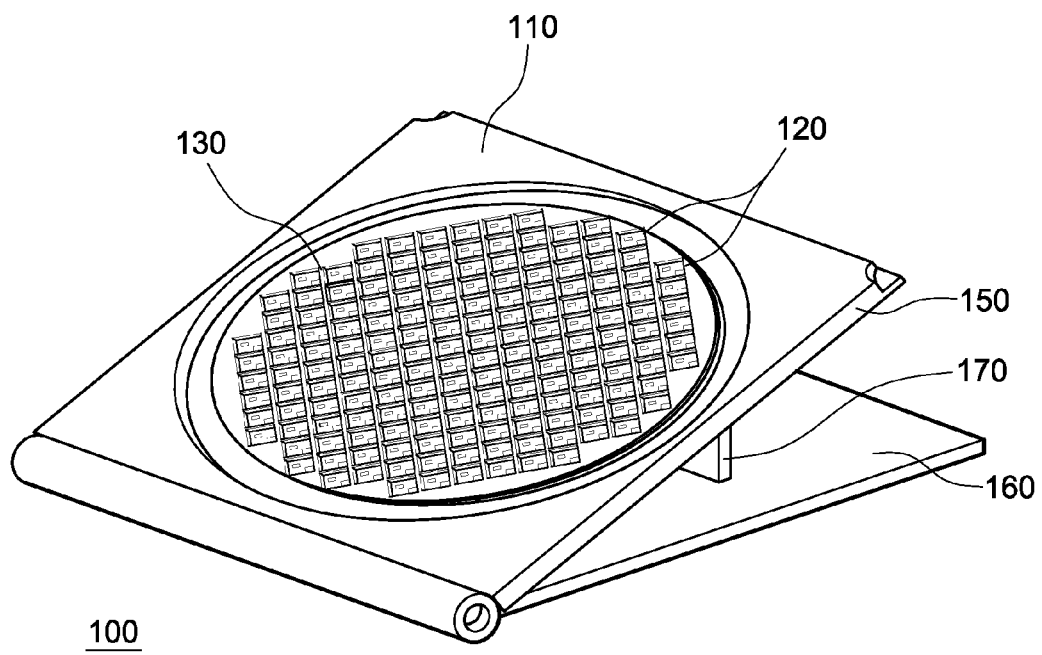
FIG. 2 (a) shows an apparatus for aligning electronic components, comprising a tiltable positioning member.
Figure 2B:
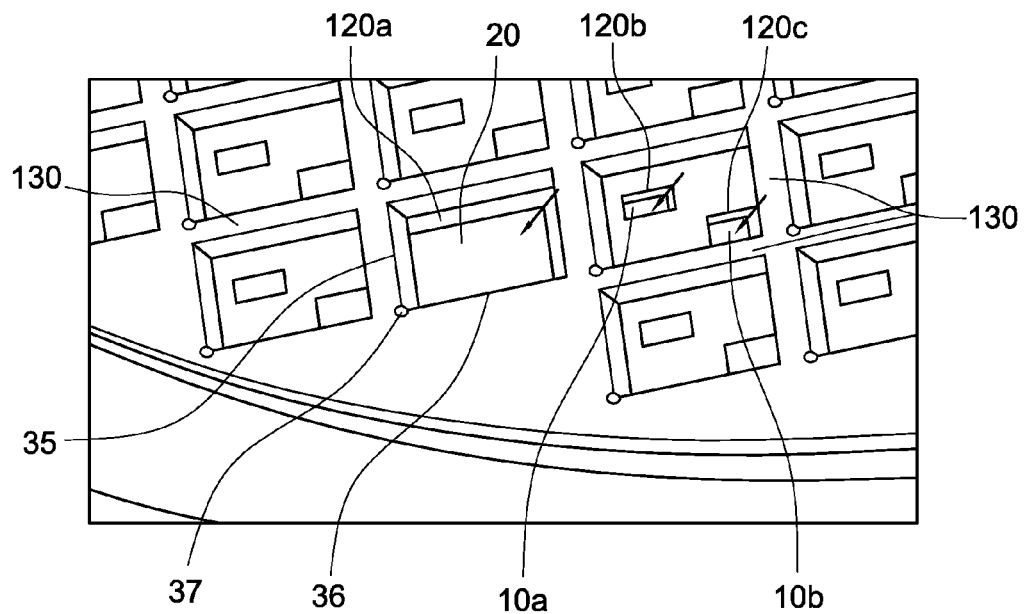

FIG. 2 (a) shows an apparatus 100 for aligning electronic components. It comprises a positioning member 110. The positioning member comprises a plurality of formations 120 for receiving electronic components. Each formation 120 is able to receive one or more electronic components and has lateral boundaries 130 for restricting movement of an electronic component. The positioning member 110 is tiltable so that the force of gravity may be used to aid alignment of the electronic components with each other and with the lateral boundaries of the formations.

In the embodiment of FIG. 2 (a) the positioning member 110 is supported by a supporting member 150. The supporting member 150 is mounted to a stage 160. A tilting mechanism 170 is provided for controlling and adjusting the tilt of the positioning member (and the supporting member 150). The arrangement of FIG. 2 (a) is an example only and a person skilled in the art will be aware of various different ways of controlling the tilt of the positioning member.

FIG. 2 (b) shows some of the formations 120 for receiving electronic components in more detail. In this embodiment, the formations 120 are cavities in the positioning member 110 and the lateral boundaries 130 are sidewalls of the cavities 120. While this is a preferred arrangement, other types of formation which are not cavities, but which can receive the electronic components, are possible and will be described later.

The positioning member 110 is tiltable in such a way that, when the positioning member is tilted, any electronic components in the formations 120 move under the force of gravity to contact a lateral boundary of the formation. FIG. 2 (b) illustrates how when the positioning member is tilted, an electronic component 20 moves under the force of gravity to a corner 37 of the cavity 120a in which it is located. That is gravity provides a force which urges the electronic component towards a lateral boundary (e.g. wall) of the formation. When the electronic component contacts the lateral boundary, it is aligned in the desired fashion.

It will be noted that in the arrangement of FIGS. 2 (a) and (b) the direction of the force is such that the electronic component is urged into contact with two adjoining walls (lateral boundaries) 35, 36 of the cavity. This is preferred as when the electronic component is aligned with two adjoining lateral boundaries, its exact position is fixed. This direction of force may be achieved by arranging the tilt, or the orientation of the position member (or the orientation of the formations in the position member) such that the gravitational force has a component towards both adjoining lateral boundaries (and most preferably to a corner of the cavity).

The positioning member in the example shown in FIG. 2 (a) has a plurality of layers. The cavity 120a and electronic component 20 are in a second layer of the positioning member. Cavities 120b and 120c and electronic components 10a and 10b are in a first layer of the positioning member. The electronic components 10a and 10b are also urged towards and aligned with the corner of the respective cavities in which they are located.

By choosing appropriate layers and appropriate position and size of cavities, the desired positioning and alignment of various electronic components can be achieved.

The layers of the positioning member 110 will now be described in more detail with reference to FIG. 3. The positioning member 110 comprises a second layer 200 having a plurality of formations 120a for receiving electronic components and a first layer 220 having a plurality of formations 120b, 120c for receiving electronic components. A base 230 may be placed beneath these layers and may form a base of the positioning member 110. Alternatively the supporting member 150 may act as a base.

Figure 4:
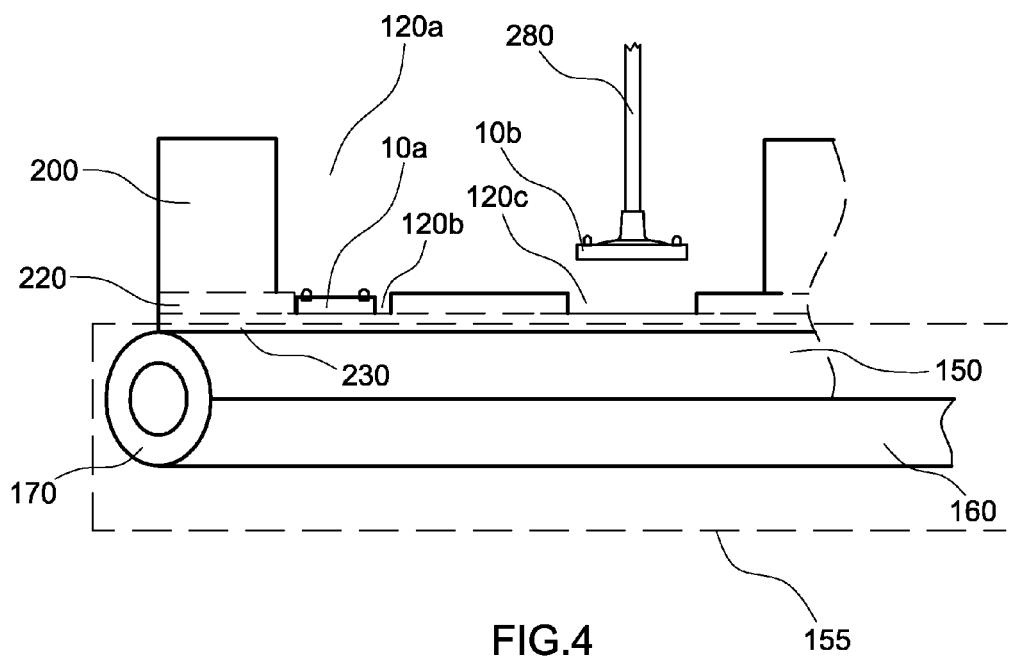
FIG. 4 illustrates a supporting stage of the apparatus of FIG. 2 and a die bonding head for placing the electronic components.

FIG. 4 is a schematic view of a part of the apparatus 100 for aligning electronic components. It has a supporting member 150 and stage 160, which together form a supporting part 155. The positioning member is mounted on the supporting member 150. The positioning member comprises a base 230, a first layer 220 having cavities 120a, 120b for receiving electronic components and a second layer 200 for receiving electronic components. The second layer 200 has a cavity 120a for receiving electronic components. The apparatus has a tilting mechanism 170 for tilting the supporting member 150 and the positioning member mounted on the supporting member relative to the stage. The apparatus is shown with the positioning member in a non-tilted position in which components can easily be placed in the cavities. Electronic components can be placed in the cavities by using a positioning device 280, such as a die bonding head.

The electronic components may be stacked on top of each other in the formations (e.g. cavities) of the positioning member and aligned by tilting the positioning member. When aligned with the sidewalls (lateral boundaries) of the cavities, the electronic components become aligned with each other. That is the electronic components become aligned with both other components within the same cavity and with components in different cavities, as the various cavities are located in a configuration which gives the desired relative positioning of the electronic components.

The electronic components can be stacked on top of each other. Furthermore, if desired, the electronic components can be stacked on top of a wafer substrate. The wafer substrate may itself comprise electronic components (e.g. ICs) which have been fabricated in the wafer, but not yet separated from each other. Individual electronic components are sometimes called 'dies'. Generally, but not in all cases, electronic components are fabricated in a wafer and the wafer is then diced to separate the individual components. When stacking electronic components, individual 'die' electronic components may be stacked one on top of the other, in addition or alternatively a 'die' electronic component may be stacked onto a wafer which may contain one or more (un-separated) electronic components.

FIG. 5 is a schematic diagram showing a plurality of electronic components stacked on top of each other in a positioning member. The positioning member has a base 230, first layer 220 and second layer 200. One electronic component is placed in each cavity in the first layer 220. Two electronic components 20, 30 are placed in a cavity of the second layer 200. As can be seen the cavities are larger than the electronic components which they accommodate and therefore each electronic component is able to move to a degree within the cavity. By tilting the positioning member gravity produces a force urging the electronic components towards sidewalls of the cavities. In this way the electronic components are aligned with sidewalls of the cavities and with each other.

FIG. 6 shows an arrangement in which electronic components are stacked on top of a wafer substrate 300. The positioning member in this example has just one layer 200. The wafer substrate 300, on which the electronic components are to be stacked, is placed between a layer 200 of the positioning member and the base layer 230 of the positioning member. Alternatively the wafer may be placed directly on a base which is not part of the positioning member (e.g. directly onto the supporting surface 150). Electronic components 30, 20 are stacked one on top of each other inside a cavity of the positioning member. The bottom most electronic component 20 contacts with the substrate wafer 300. The substrate wafer may optionally itself comprise one or more electronic components in which case the cavity of the positioning member is preferably aligned with contacts of the electronic component of the substrate wafer 300; this may be carried out by using standard visual alignment techniques, which are known in the art.

Figure 7:
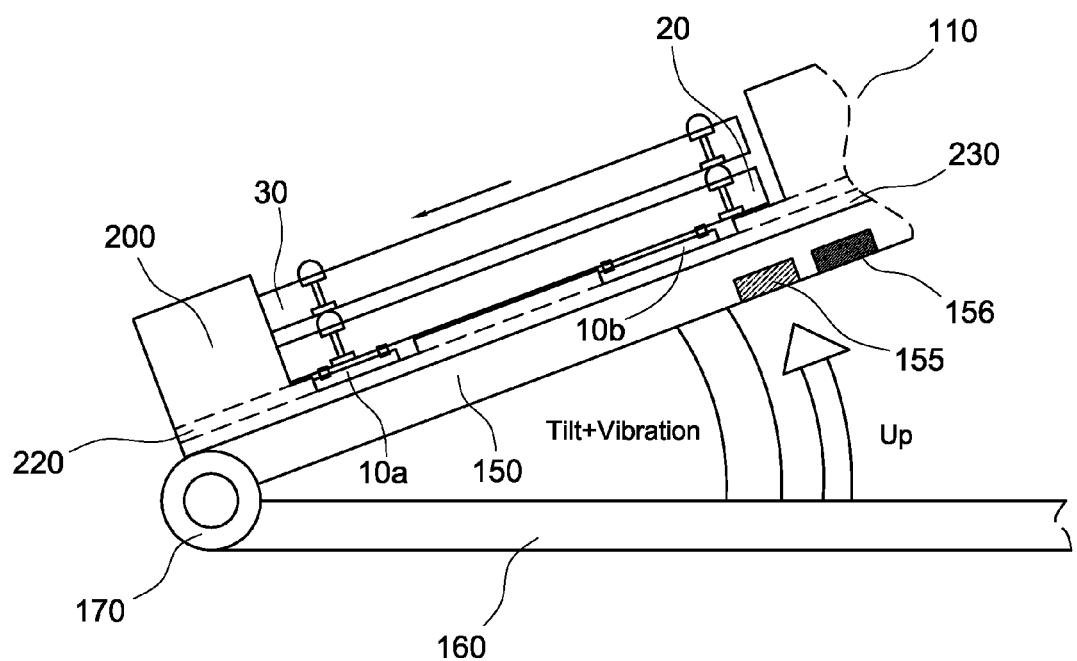
FIG. 7 is a side on schematic view illustrating tilting of the positioning member.

FIG. 7 shows the arrangement of FIG. 4 with stacked electronic components when the positioning member is tilted. The tilting mechanism 170 is activated and tilts the supporting member 150 relative to the stage 160. The positioning member 110 is tilted also as it is mounted on the stage. As can be seen, the electronic components 10a, 10b, 20, 30 move under the force of gravity to align with the sidewalls of the cavities in which they are placed. The electronic components 20, 30 which are placed in the same cavity are thus aligned with each other (have their edges aligned with each other). Meanwhile the electronic components 10a, 10b in the first layer become aligned with sidewalls of the respective cavities in which they are placed. They thus have the desired spatial positioning relative to each other and relative to the electronic components 20, 30 in the layers above (and if present relative to the wafer 300 in the layer below). In order to assist the alignment process the positioning member may be caused to vibrate, e.g. by sending a sound wave through the positioning member causing the positioning member to vibrate. Alternatively a mechanic vibrator may be used to vibrate the positioning member. The vibration helps overcome friction and allows the electronic components to move and also helps to prevent damage to the components. A vibrating device 155 may be provided in the apparatus for causing the positioning member to vibrate. In addition, or alternatively, the positioning member may be heated; the heating helps to overcome friction so as to facilitate movement of the electronic components and may also help to prevent friction damage. The apparatus may have a heating device 156 for heating the positioning member; the heating device may be provided in the supporting member 150 or at another convenient location.

Figure 3:
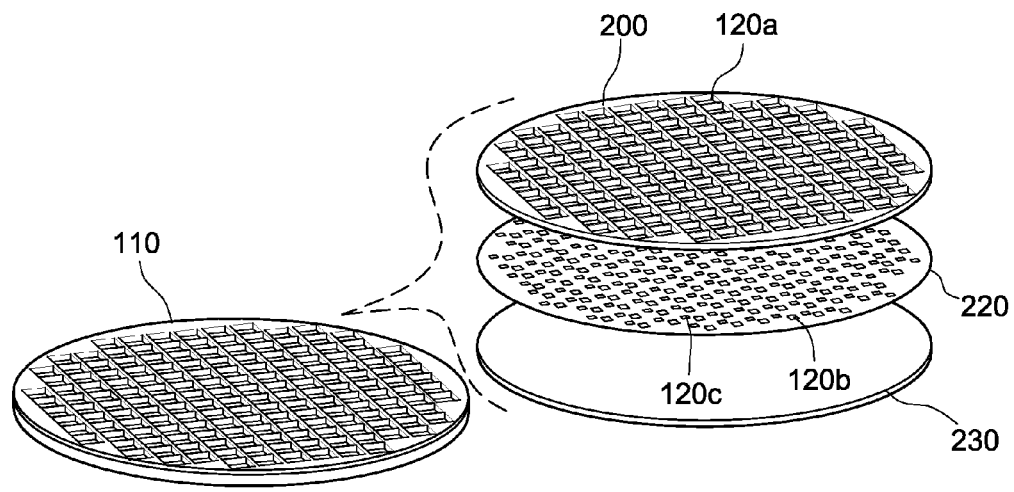
FIG. 3 illustrates the positioning member of FIG. 2 (a) in more detail and in particular illustrates its first and second layers and a supporting layer.

While only two cavities in the first layer 220 and a single cavity in the second layer 200 are illustrated in FIGS. 4-7, it is to be understood that in most cases there will be more cavities, e.g. as shown in FIG. 3.

The above configurations are by way of example only. There may be only one layer of the positioning member, or two layers, or three layers or more; each with one or more formations for receiving electronic components. Each formation (e.g. cavity) may have a depth suitable for receiving only one electronic component of a particular size—as for the first layer 220 in FIG. 7, or for receiving several electronic components stacked one on top of each other, as for the second layer 200 in FIG. 7. The first layer may be deeper than shown in FIG. 7 and may be able to accommodate several stacked electronic devices. Equally the second layer may be shallower than shown in FIG. 7 and designed for receiving only one electronic component per cavity. While FIG. 3 shows each layer having a plurality of formations (e.g. cavities) of the same size; a single layer may have several different sizes of formation for receiving different sizes of electronic component. Furthermore, the formations need not be equally spaced apart as shown in FIG. 3. Other variations and modifications will be apparent to a person skilled in the art.

The size, depth and location of the formations in each layer is designed to give the desired position for the electronic components relative to each other (and to any wafer below) according to the particular application. In use electronic components are placed into some or all of the formations as desired. It is not necessary that electronic components are placed in all of the formations, although it will usually be even more efficient to use all of the formations so that a maximum number of components can be aligned in one go.

While tilting and the force of gravity has been described above as the method of aligning the electronic components, many other ways of providing the necessary force are possible. Two possible alternative methods of providing the force for aligning the electronic components will now be described below.

Figure 8:
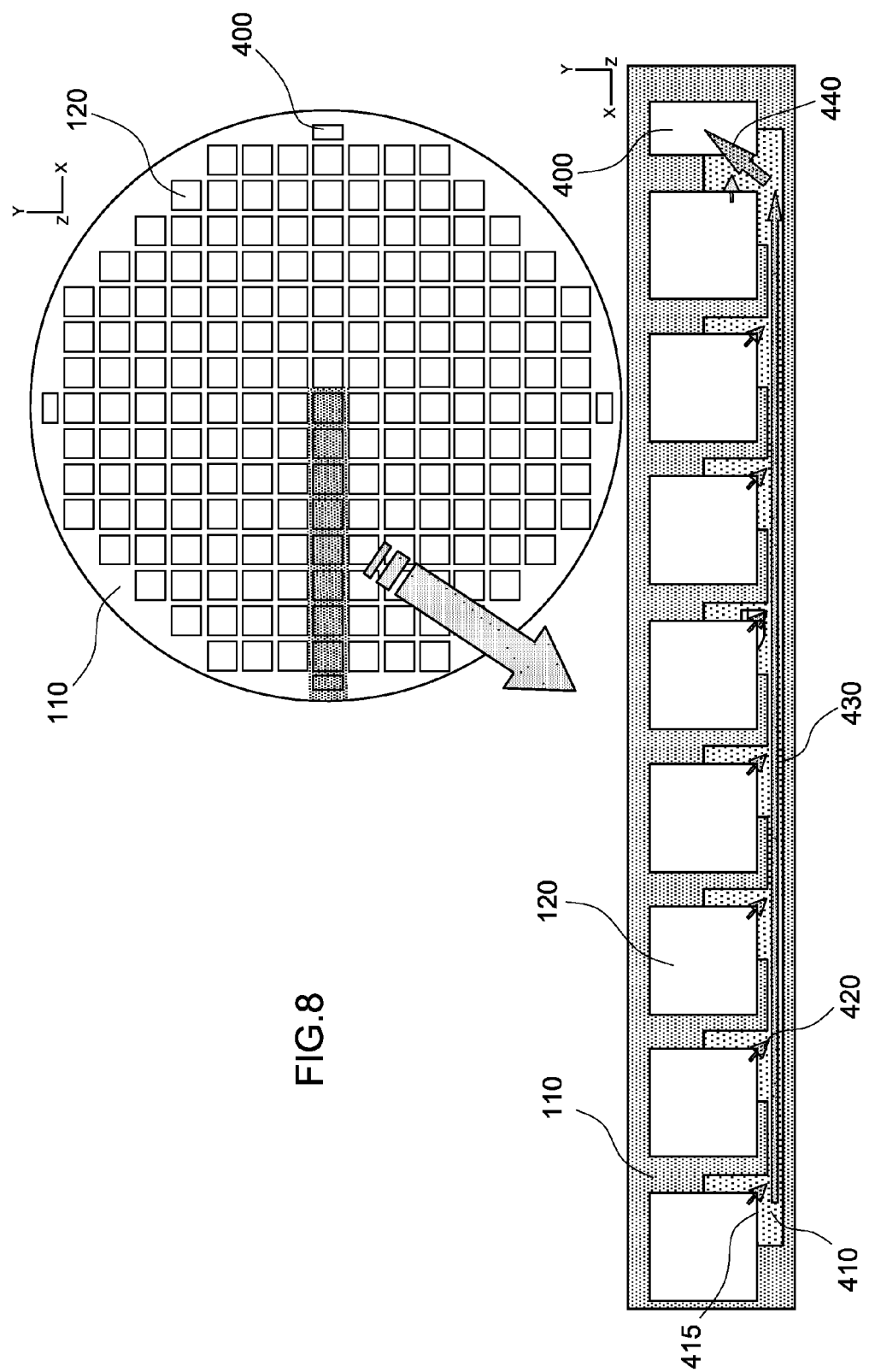
FIG. 8 illustrates a positioning member with a vacuum channel for applying a suction force for aligning the electronic components.

FIG. 8 shows an apparatus which uses suction to align the electronic components. The positioning member 110 has a plurality of cavities 120. The cavities are linked to a channel 410 for conveying suction to the cavities. In the example shown in FIG. 8 a corner of each cavity has one or more apertures 415 communicating with the channel 410. The channel 410 preferably joins a plurality of the cavities and leads to an inlet or outlet 440. The inlet or outlet may be joined to a suction device or vacuum source. Flow of air from the cavities is shown by arrows 420, while flow of air along the channel is shown by line 430. Flow of air to the inlet or outlet 440 is shown by arrow 440. When the suction is turned on, the suction provides a force urging the electronic component to the corner of the cavity. The side edges of the electronic component are thus aligned with the sidewalls adjoining the corner of the cavity. Preferably the apertures 415 have a height which is equal to or more than the total height of the electronic components which are expected to be introduced into the cavity in which it is located. In general, but not necessarily, the various apertures 415 will have the same height as each other and as the channel 410.

Figure 9:
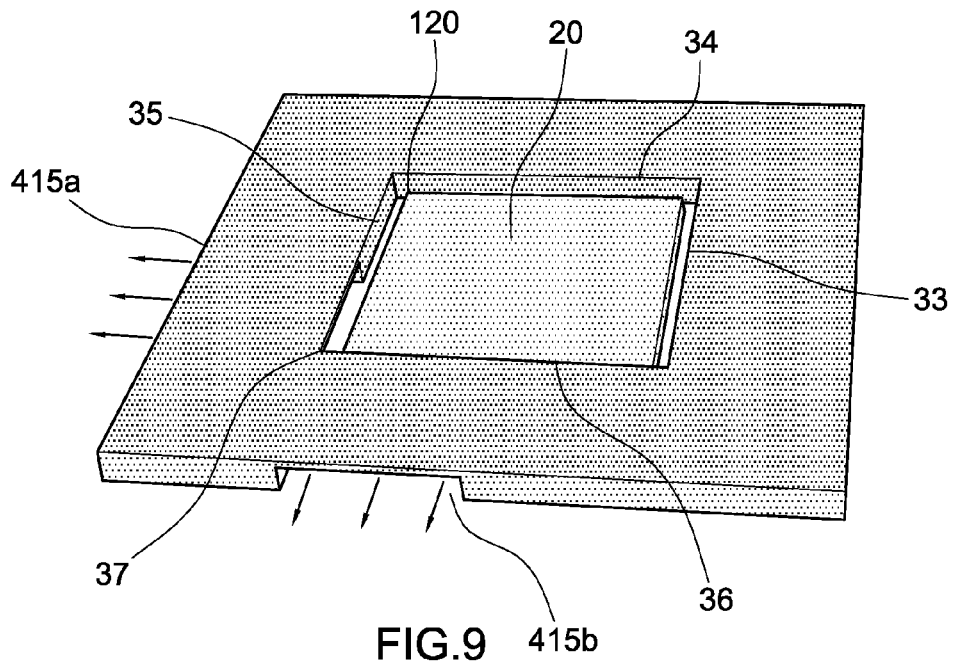
FIG. 9 illustrates a cavity of the positioning member of FIG. 8 in more detail.

An example of one cell (cavity) of the positioning member is shown in more detail in FIG. 9. The cavity has four side walls 33, 34, 35, 36 which act as lateral boundaries for constraining movement of an electronic component within the cavity. Sidewalls 35 and 36 join at a corner 37. A first aperture 415a is provided in sidewall 35 near corner 37 and a second aperture 415b is provided in a sidewall 36 near corner 37. Air flow (suction) from both of these apertures to the channel 410 provides two forces which together combine to form a force urging the electronic component 20 towards the corner 37 of the cavity. When the electronic component moves towards the corner and contacts the side walls 35 and 36 it becomes aligned with the sidewalls. By virtue of this fact it may also become aligned with any other electronic components in the same cavity and/or with electronic components in other cavities of the positioning member.

Figure 10:
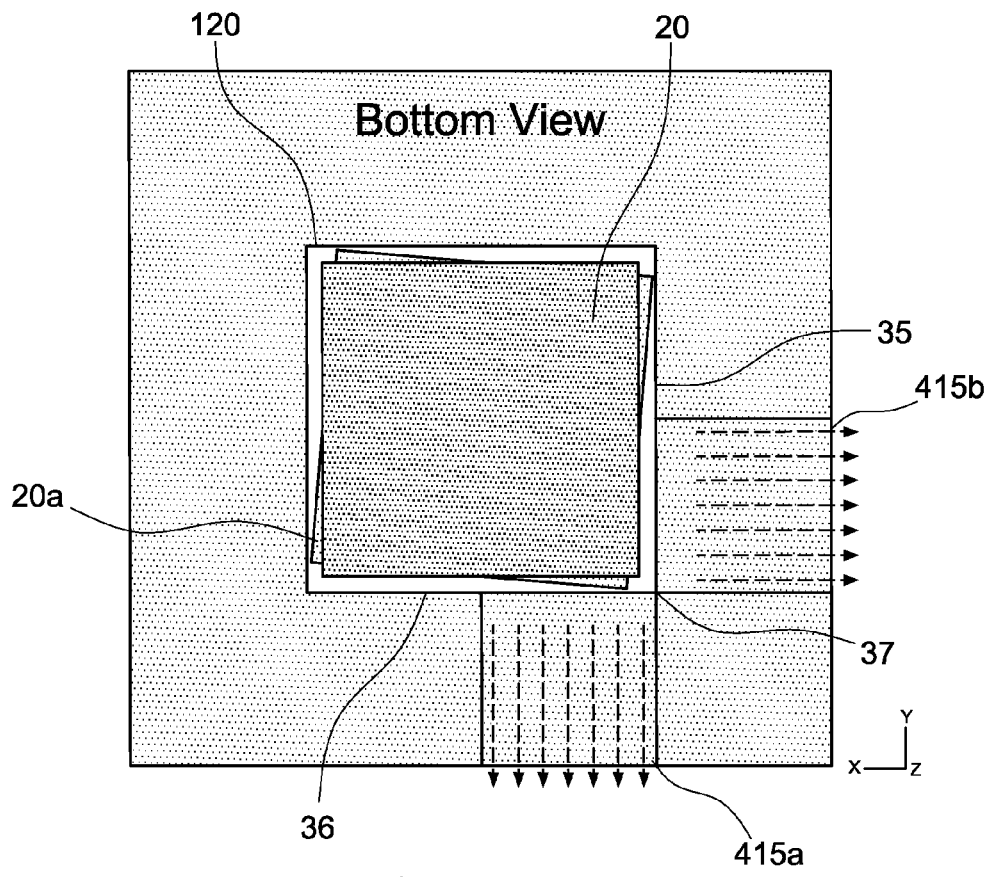
FIG. 10 illustrates alignment of an electronic component with a corner of the cavity.

FIG. 10 is a bottom-up view of the cavity 120 and electronic component 20 when suction is applied. The suction forces are shown by the dashed arrow lines. The shadow lines 20a show the position of the electronic component when it is mis-aligned before suction is applied. The solid block 20 shows the position of the electronic component when suction is applied and has caused the electronic component to rotate to align with the sidewalls of the cavity 120. Next the suction will cause the electronic component 20 to move towards the corner 37 so that it contacts with and is fully aligned with the sidewalls 35 and 36.

While suction is described above, it may alternatively be possible to use positive air pressure to blow the electronic components into alignment. Another possibility is to use a positive pushing force generated by one or more actuators. Any suitable type of actuators may be used; an actuator comprising piezo-electric materials or an actuator comprising polymer based materials are two possible examples. An example of the configuration is described below.

Figure 11A:
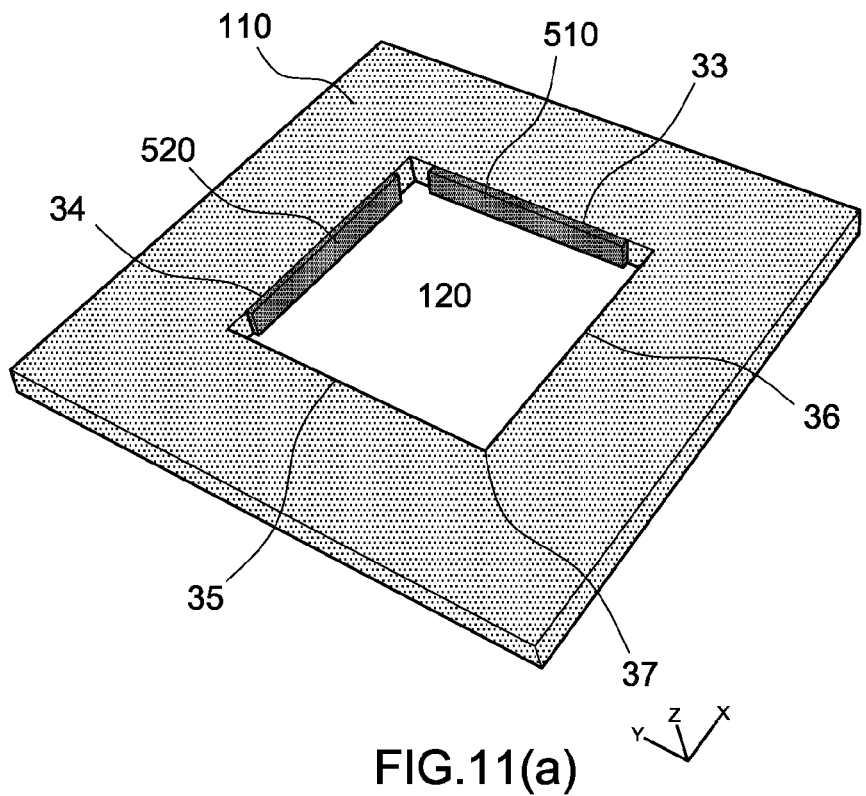
FIG. 11 (a) illustrates a cavity of a positioning member with actuators for aligning the electronic components.
Figure 11B:
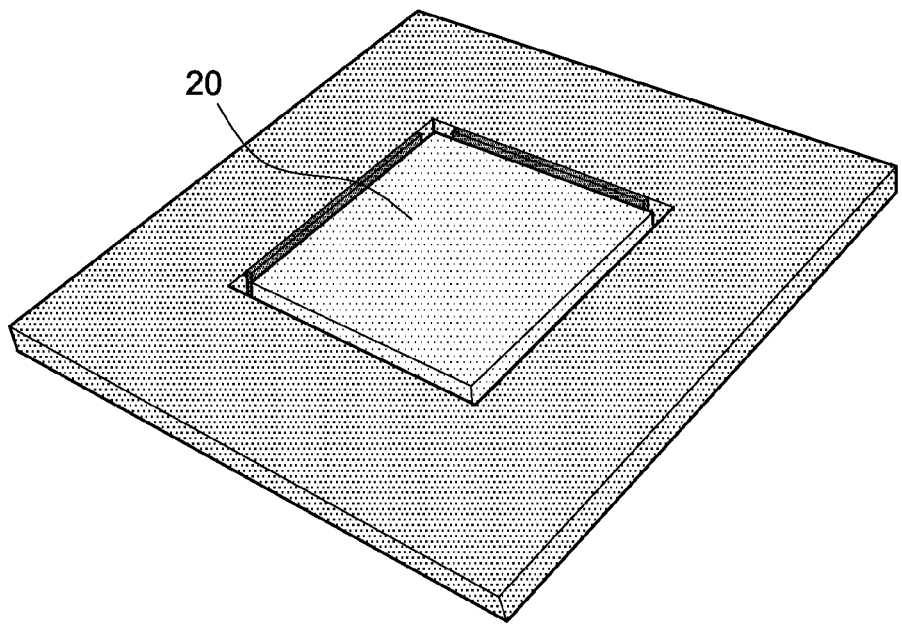

FIG. 11 (a) is a perspective view showing one cavity 120 of a positioning member 110. The cavity has sidewalls 33, 34, 35 and 36. Sidewalls 35 and 36 adjoin at a corner 37. A first actuator 510 and second actuator 520 are provided for providing forces for pushing an electronic component in the cavity into alignment with the sidewalls. In this example the first actuator 510 is on the sidewall 33 opposite sidewall 35 and generates a force pushing towards sidewall 35. The second actuator 520 is on the sidewall 34 opposite sidewall 36 and generates a force pushing towards sidewall 36. Together these forces have the effect of pushing the electronic component towards the corner 37 adjoining sidewalls 35 and 36. The first and second actuators may comprise a piezoelectric driver or polymer driver (e.g. a piezoelectric or polymer element which expands or changes shape on application of an electric signal). The working of these and other possible alternative types of actuator will be apparent to a person skilled in the art.

FIG. 11 (b) shows the cavity of FIG. 11 (a) when filled with one or more electronic components 20.

Figure 12A:
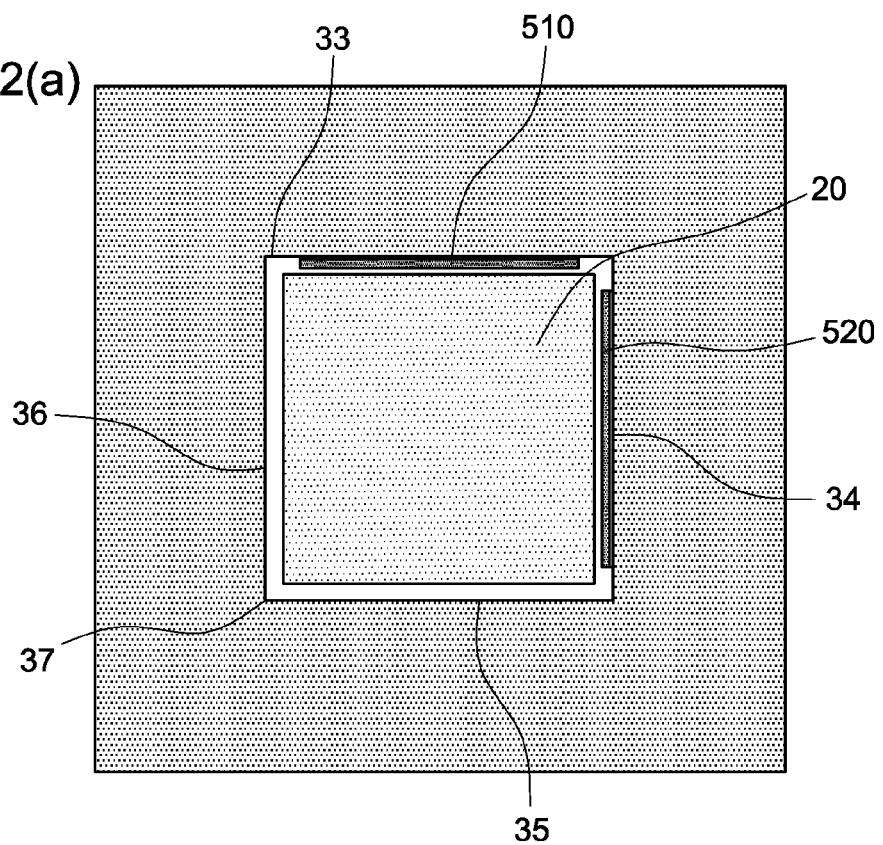
FIGS. 12 (a) and (b) illustrate alignment of an electronic component within a cavity using actuators.
Figure 12B:
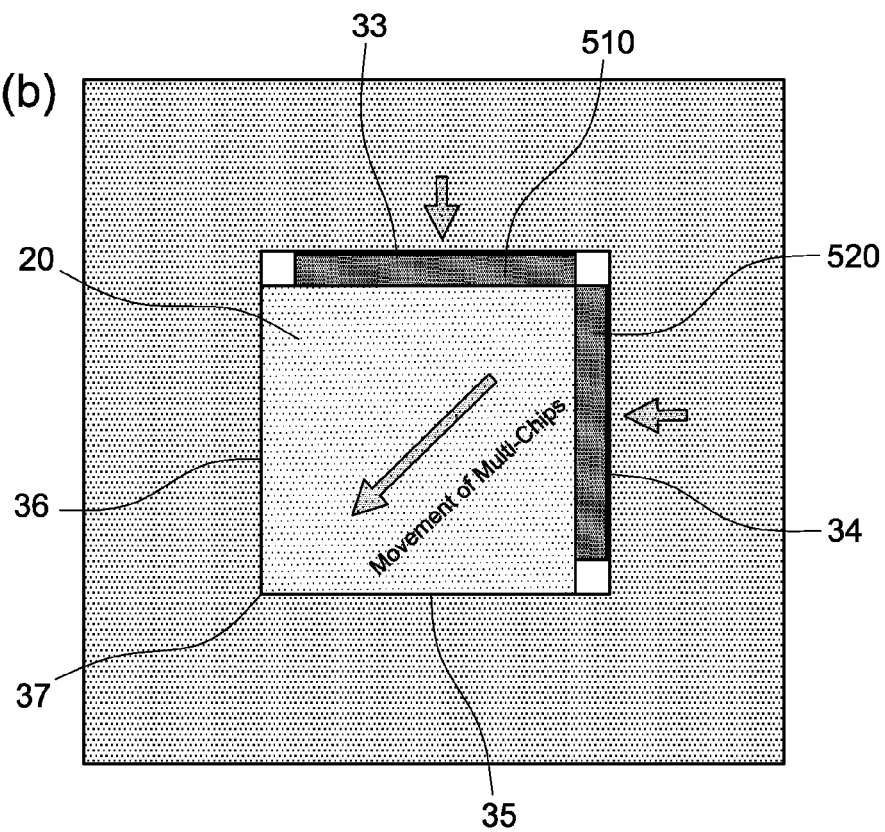

FIG. 12 (a) is a plan view showing the cavity of FIG. 11 (b) before the electronic component 20 is aligned with the sidewalls. FIG. 12 (b) shows the situation after actuators 510, 520 have been activated to push the electronic component 20 towards corner 37 and into alignment with the side walls 35, 36. A plurality of electronic components may be stacked one on top of the other in the cavity. In that case the actuators align all of the electronic components together, by pushing them into alignment with the sidewalls 35, 36 and into alignment with each other. While only one cavity has been illustrated and described above, it is to be understood that there may be a plurality of cavities in the positioning member, each with respective actuators. The configuration of cavities in the positioning member may be similar to that shown in FIG. 2 illustrating the tilting embodiment. Furthermore, there may be a plurality of layers of the positioning member each with respective formations (e.g. cavities).

Preferably a circuit for powering and controlling the actuator or actuators is provided in the positioning member. Where the actuator or actuators comprise a piezoelectric material, a circuit for providing power to the actuator is preferably fabricated in the positioning member to provide power to the actuator or actuators (application of electrical power causing the deformation of the piezoelectric actuators). Where the actuator or actuators comprise a polymer based material a heating element may be provided in the positioning member, especially in or on the lateral boundary for heating the actuator (thus causing its deformation). For example, the heating element may be a circuit with high electrical resistance adjacent a lateral boundary of the positioning member. When electric power is supplied to the circuit, heat is generated around the circuit locally which heats the actuator causing its deformation.

The actuator or actuators preferably comprise a thin film attached to the lateral boundaries (e.g. the sidewall surface). Where the actuator comprises piezoelectric material certain bonding materials (e.g. with a thickness of several um) may be provided between the actuator and lateral boundary (e.g. sidewall) in order to attach the actuator to the lateral boundary. For an actuator comprising a polymer based material, the actuator may be coated directly onto the lateral boundary (e.g. sidewall) at a certain temperature. The material selection for polymer based materials may be determined by the designer based on the heating temperature used for actuation and the expected gap between the actuator and the electronic component when an electronic component is placed in the formation and before alignment has taken place; CTE is an example of one appropriate material.

The suction channel and actuator embodiments described above may be mounted to a supporting member 150 and may have a vibrating device and/or heating device as described in the other embodiments above.

Figure 13:
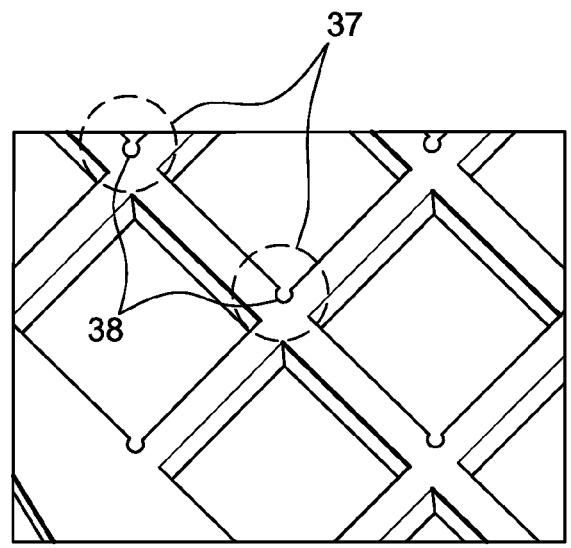
FIG. 13 illustrates a positioning member with cavities and relief holes at a corner of the cavity.

FIG. 13 is a close up view of some of the cavities of a positioning member. It can be seen that the corners 37 of the cavities have a small notch or 'relief hole' 38 rather than a sharp corner. This prevents contact of the fragile corner of the electronic component with the corner of the cavity, when the electronic component is moved towards the corner by the force for aligning the electronic component. Unwanted damage and cracking of the electronic component can thus be avoided. This design feature may be applied to any of the embodiments described above.

Figure 14:
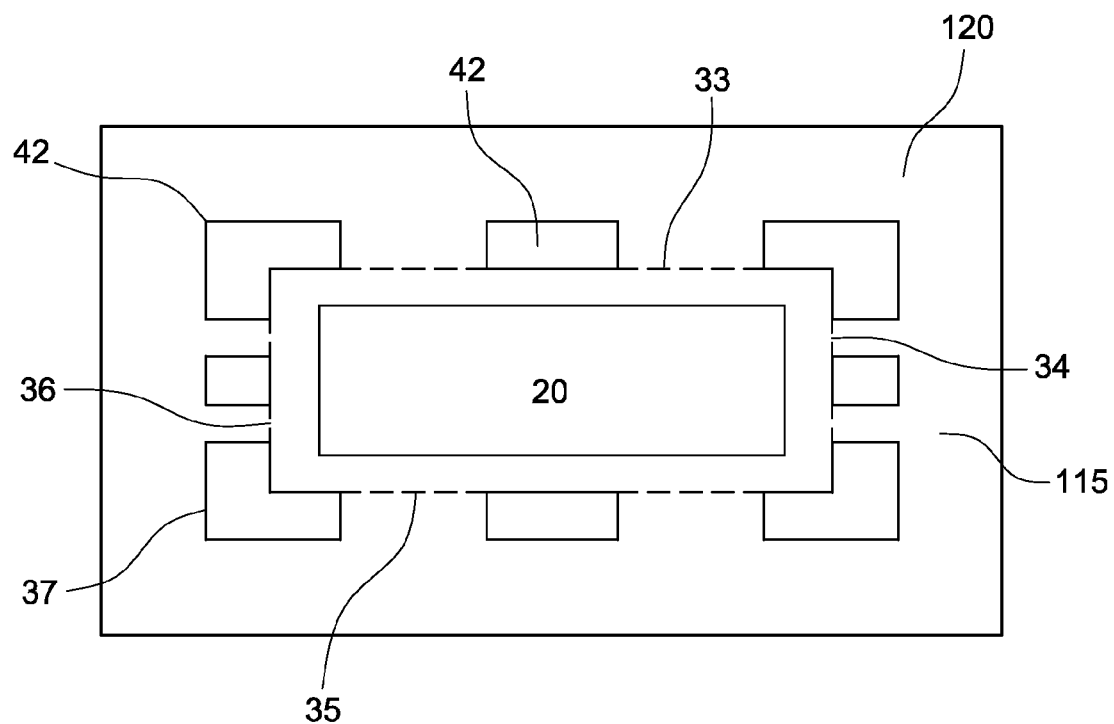
FIG. 14 illustrates a positioning member with a formation comprising protrusions which form lateral boundaries for constraining movement of an electronic component.

As mentioned above the formations for receiving the electronic components need not be cavities. FIG. 14 illustrates a formation 120 for receiving an electronic component, having lateral boundaries for restricting movement of the electronic component. The formation is not a cavity. Rather it comprises a series of posts or protrusions 42 from a base 115. The protrusions together form effective lateral boundaries 33, 34, 35, 36 shown by the dashed lines. Movement of the electronic component is restricted within these lateral boundaries. An electronic component 20 is shown inside the formation 120. The positioning member may have a plurality of such formations. In other respects the positioning member and apparatus operates as described in the embodiments above.

A method of aligning electronic components and of manufacturing a stack of electronic components will now be described.

First a wafer 300 is located on a worktable or a base 230 of a positioning member using a wafer transfer system (this step is optional and need not be carried out if the components are not to be stacked on a wafer). Next a layer of the positioning member 110 is located on the wafer 300 by using the wafer transfer system. The positioning member may be located using a visual alignment method, so that it has the desired alignment with the wafer and with any particular features of the wafer. If the electronic components are not to be stacked on a wafer, then the positioning member 110 (comprising one or more layers) may simply be provided before moving to the next step which is described below Next the electronic components are stacked in the formations of the positioning member. Where appropriate a plurality of electronic components may be stacked one on top of the other in the same formation. If there are several layers of the positioning member then electronic components are placed in the formations of the first level of the positioning member before the next layer of the positioning member is placed on top and electronic components are then placed in the formations of the next layer etc. The stacking of electronic components in the formations can be carried out quickly using low level visual alignment. A force is then generated for aligning the electronic components with the lateral boundaries of the formations in which they are located. This may be done by, for example, tilting the positioning member, applying suction, or using actuators as described above. The electronic components and (if present) the wafer 300 are then bonded together to form the stacked arrangement of electronic components. The positioning member is then removed. If the electronic components are stacked on a wafer, then the wafer may then be diced (cut into separate pieces) to separate the various stacks from each other.

While preferred embodiments of the present invention have been described above with reference to the accompanying drawings, this is by way of example only and should not be taken to limit the scope of the invention which is defined by the claims. Various modifications and variations may be made without departing from the scope of the claims, as will be apparent to a person skilled in the art.

What is claimed is:

1. An apparatus for aligning electronic components comprising:
    a positioning member having at least one formation for receiving an electronic component;
    said at least one formation having lateral boundaries for constraining movement of the electronic component;
    an alignment mechanism for providing a force for actively aligning one or more electronic components placed in said at least one formation with a lateral boundary of said at least one formation; and
    a vibrating device for causing the positioning member to vibrate.

2. The apparatus of claim 1 wherein the positioning member has a plurality of formations for receiving electronic components, the formations having lateral boundaries for constraining movement of the electronic components.

3. The apparatus of claim 2 wherein the plurality of formations is a plurality of cavities in the positioning member and said lateral boundaries are sidewalls of the cavities.

4. The apparatus of claim 1 comprising a tilting mechanism for tilting the positioning member so that the electronic components are aligned with lateral boundaries of said cavities under force of gravity.

5. The apparatus of claim 1 comprising a heater for heating the positioning member for aligning and welding the one or more electronic components.

6. The apparatus of claim 1 wherein the alignment mechanism comprises one or more actuators for each formation for pushing the electronic components into alignment with a lateral boundary of the formation.

7. The apparatus of claim 2 wherein the positioning member has a first layer having a plurality of formations for receiving first electronic components and a second layer having a plurality of formations for receiving second electronic components.

8. The apparatus of claim 1 wherein the alignment mechanism provides a force for aligning the electronic component with two adjoining lateral boundaries of said at least one formation.

9. An apparatus for aligning electronic components comprising:
    a positioning member having at least one formation for receiving an electronic component;
    said at least one formation having lateral boundaries for constraining movement of the electronic component; and
    an alignment mechanism for providing a force for actively aligning one or more electronic components placed in said at least one formation with a lateral boundary of said at least one formation;
    wherein the at least one formation is a cavity in the positioning member and wherein the alignment mechanism is a vacuum channel for applying suction force to the cavity so as to draw the one or more electronic components into alignment with a side wall of the cavity.

10. The apparatus of claim 9 wherein the suction force is applied to a corner of the cavity so as to draw said one or more electronic components to the corner of the cavity until contacting with two adjoining walls of the cavity.

* * * * *